United States Patent [19]

Mohri et al.

[11] 4,399,089
[45] Aug. 16, 1983

[54] METHOD OF PRODUCING GLAZED CERAMIC SUBSTRATE

[75] Inventors: Yoshio Mohri; Tsutomu Ikeda; Takashi Hiroishi; Kinzi Sano; Yasuhiro Yamamoto; Yuji Yamamoto; Ryoji Nakashima, all of Matsusaka, Japan

[73] Assignee: Central Glass Company, Limited, Ube, Japan

[21] Appl. No.: 337,745

[22] Filed: Jan. 7, 1982

[30] Foreign Application Priority Data

Jan. 6, 1981 [JP] Japan .................................. 56-603

[51] Int. Cl.³ .............................................. F27B 21/00
[52] U.S. Cl. ........................................ 264/57; 264/56; 264/58; 264/60; 264/62; 264/132
[58] Field of Search .................... 264/56, 57, 58, 60, 264/62, 133; 156/89

[56] References Cited

U.S. PATENT DOCUMENTS

| | | | |
|---|---|---|---|
| 3,406,279 | 10/1968 | Ziver | 264/62 |
| 3,442,994 | 5/1969 | Herbert | 264/57 |
| 3,792,139 | 2/1974 | Weinstein | 264/58 |
| 3,904,352 | 9/1975 | Thurnaver | 264/58 |
| 4,294,635 | 10/1981 | Hurley | 264/60 |
| 4,313,900 | 2/1982 | Gonzales, Jr. et al. | 264/60 |
| 4,340,436 | 7/1982 | Dubetsky et al. | 264/58 |

Primary Examiner—Donald E. Czaja
Assistant Examiner—W. Thompson
Attorney, Agent, or Firm—Fleit, Jacobson & Cohn

[57] ABSTRACT

A method of producing a glazed ceramic substrate, which is useful for a hybrid integrated circuit or a thermal head of a thermal printer for instance, by applying a glass onto a major surface of a ceramic substrate, firing the substrate to form a molten glass layer on the substrate surface and cooling the fired substrate. To obtain the glazed ceramic substrate with high flatness despite the tendency of the substrate to warp due to difference in thermal expansion coefficient between the ceramic and the glass, a refractory base which supports the substrate during the firing and cooling steps is so shaped as to allow the substrate to deform during the firing step reversely to the expected warp at the cooling step, so that the warp at the cooling step is offset by the preceding deformation. For example, the upper surface of the base is shaped into a continuous and concave surface. As a modification, suitably shaped rib-like or pillar-like spacers are arranged on the top face of a flat base plate with intervals therebetween.

19 Claims, 14 Drawing Figures

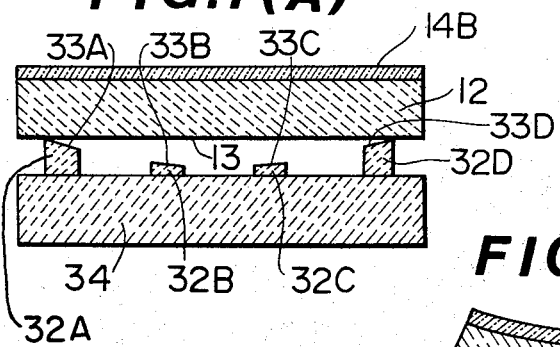
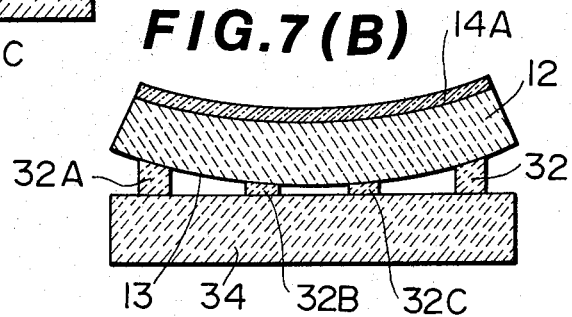
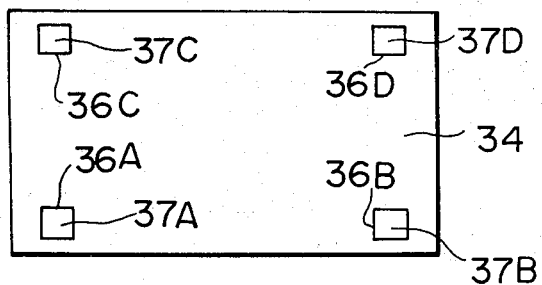
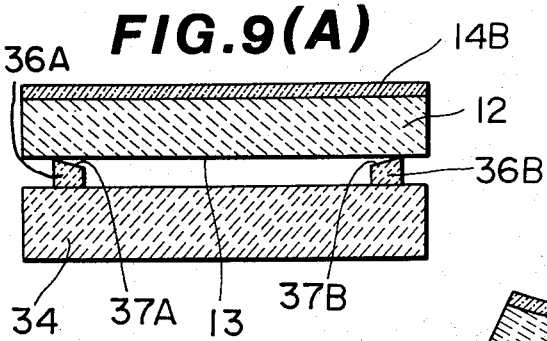
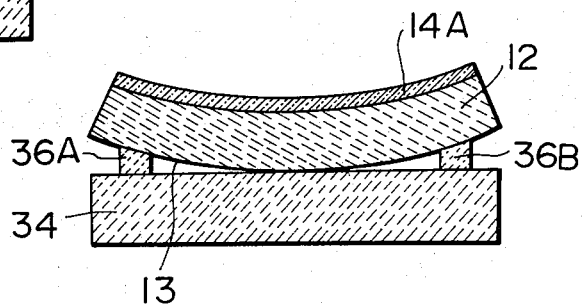

METHOD OF PRODUCING GLAZED CERAMIC SUBSTRATE

BACKGROUND OF THE INVENTION

This invention relates to a method of producing a so-called glazed ceramic substrate by forming a glass coating layer on a major surface of a ceramic substrate by firing the substrate and then cooling the substrate to allow the molten glass layer to turn into a solid coating layer.

Recently there has been an increasing trend to glaze a major surface of a ceramic plate, such as alumina plate, in order to utilize the glazed ceramic plate as a substrate of an electric or electronic device. A ceramic substrate having a glass coating is commonly called a glazed ceramic substrate and features high smoothness of its glazed surface besides the favorable characteristics of the ceramic substrate such as high stability at high temperatures and good workability.

At present glazed ceramic substrates are largely used in manufacturing hybrid integrated circuits. Each glazed ceramic substrate for this use is relatively small in size, and the glass coating of the glazed ceramic substrate is not required to be highly heat-resistant. Therefore, it is not so difficult to select a glass composition suitable as the coating material, that is, to select a glass which can readily be fused onto a ceramic substrate at a relatively low heating temperature and is low in the content of alkali metals, which are unfavorable for the electric characteristics of the coating layer, and comparable in the coefficient of thermal expansion to the ceramic substrate. The comparableness in thermal expansion coefficient between the glass and the ceramic is desired from the viewpoint of obtaining a glazed ceramic substrate high in flatness without suffering from warping of the substrate subjected to cooling from a high temperature during the glazing procedure.

Meanwhile, there is a increasing trend to use glazed ceramic substrates in manufacturing thermal heads of thermal printing devices. Glazed ceramic substrates for this use are generally required to be very high in stability and durability of their glass coating layers at considerably high temperatures, and accordingly it becomes preferable to employ a glass composition which features highness of its transition point as the coating material. Then it becomes difficult to meet the desire of using a glass of which coefficient of thermal expansion is close to that of the ceramic substrate to be coated with the glass, and consequentially warping of the substrates subjected to the glazing procedure becomes a serious problem in industrial production of glazed ceramic substrates having satisfactory high-temperature characteristics. This problem is further augmented by the fact that relatively large-sized substrates are needful for thermal heads.

There is a possibility of suppressing warping of a glazed ceramic substrate by increasing the thickness of the ceramic substrate to be coated with glass, but this method is hardly practicable because it places great restrictions on the design of the thermal heads. For a similar reason, it is also difficult to employ a specific ceramic material which is comparable in thermal expansion coefficient to the glass having desirable high-temperature characteristics.

SUMMARY OF THE INVENTION

It is an object of the present invention to provide an improved method of producing a glazed ceramic substrate, the product of which method is high in flatness and practically free from warping even when there is a considerable difference in thermal expansion coefficient between the ceramic material of the substrate and the glass employed as the coating material.

A method according to the invention for the production of a glazed ceramic substrate has the steps of applying a glass onto a major surface of a plate-shaped ceramic substrate, firing the glass-applied substrate at a temperature above the melting temperature of the glass to thereby form a molten glass layer on the substrate, and cooling the fired substrate to allow the molten glass layer to turn into a solid coating layer. During the firing and cooling steps, the substrate is placed on a refractory base. The improvement according to the invention resides in that the refractory base is so shaped as to allow the substrate to deform during the firing step such that the deformation offsets against warping of the substrate attributed to a difference between the coefficient of thermal expansion of the glass coating and that of the ceramic substrate during the cooling step.

In the present invention it is premised that warping of the glass-coated ceramic substrate during the cooling step is inevitable, and, instead of trying to suppress the warping at the cooling step, it is contrived to let the substrate reversely deform during the firing step by using an appropriately shaped refractory base to support the substrate thereon so that the warping deformation at the cooling step may have the effect of just redressing the preceding deformation of the substrate. By this contrivance, the invention has succeeded in producing a glazed ceramic substrate with very high flatness even when use is made of a glass of which coefficient of thermal expansion is not close to that of the ceramic substrate.

Basically, the refractory base for use in the method of the invention has a continuous and curved upper surface, and the curvature of this surface is such that almost an entire area of the ceramic substrate placed on the base is spaced from the curved upper surface while the substrate remains flat but comes into contact with the curved upper surface when the substrate deforms during the heating step. In most cases the upper surface of this base is a concave surface because usually the coefficient of thermal expansion of the ceramic substrate is greater than that of the glass coated thereon and, therefore, deformation of the substrate during the firing step renders the bottom face of the substrate convex. However, there is a possibility tht the coefficient of thermal expansion of the ceramic substrate is smaller than that of the glass applied thereto, and in that case the upper surface of the base is shaped into a convex surface.

As an economically favorable modification, the refractory base in the method of the invention may consist of a flat base plate and a plurality of rib-like or pillar-like spacers, which are placed on the top face of the base plate so as to be spaced from each other and each of which has a suitably curved surface.

Other than the use of a refractory base shaped in the above summarized manner, each step of the method according to the invention can be performed in a known way. For example, the initial step of applying a glass onto a major surface of a ceramic substrate can be performed by applying a paste containing a powdered glass onto the substrate surface by utilizing the technique of screen-printing, or by placing a green sheet containing a powdered glass on the substrate surface.

BRIEF DESCRIPTION OF THE DRAWINGS

FIGS. 7(A) and 7(B) explanatorily illustrate the use of a base including the spacers of FIG. 6 in a method according to the invention;

FIG. 8 is a schematic plan view of a still simplified base for use in a method according to the invention; and FIGS. 9(A) and 9(B) explanatorily illustrate the use of the base of FIG. 8 in a method according to the invention.

DESCRIPTION OF THE PREFERRED EMBODIMENTS

A typical and industrially profitable method of forming a glass coating layer on a major surface of a plate-shaped ceramic body is a printing-firing method, which has the steps of applying a paste containing a powdered glass onto the surface of the ceramic body usually by utilizing the technique of screen-printing so as to form a paste layer of a uniform thickness, drying the printed paste layer to dissipate the liquid component of the paste, firing the paste-applied ceramic body so as to melt the glass contained in the printed paste layer, and thereafter cooling the fired body to allow the molten glass layer to turn into a solid coating layer. The firing temperature and the firing time are so determined as to obtain the coating layer with high smoothness of the surface.

The paste is a uniform dispersion of a finely powdered glass in a liquid vehicle, usually an organic liquid material. A preferred example of useful organic liquid materials is terpineol. Optionally, the paste may additionally contain an organic polymeric substance that serves as a viscosity adjusting agent, such as ethyl cellulose for example.

Figure 1A:
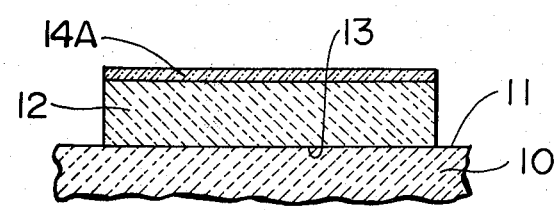
FIG. 1(A) is a schematic and sectional view of an unfinished glazed ceramic substrate at a heating stage in a conventional production method.
Figure 1B:
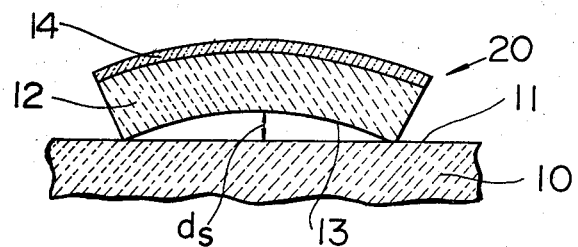
FIG. 1(B) explanatorily shows the manner of warping of a glazed ceramic substrate at the end of a cooling stage in the conventional production method.

To form a glass coating layer with a uniform thickness, the plate-shaped ceramic body or unfinished glazed ceramic substrate is held horizontally during the firing and cooling steps in the above described method. Referring to FIG. 1(A), at the firing step in a conventional firing-printing method, a plate-shaped ceramic body or ceramic substrate 12 is placed on a supporting plate or base 10 of a refractory material having a flat upper surface 11. The bottom face 13 of the ceramic substrate 12 is in close contact with the flat surface 11 of the base 10, and the upper face of the ceramic substrate 12 is covered with a molten glass layer 14A. At the subsequent cooling step both the ceramic substrate 12 and the glass layer 14A, which is solidifying, undergo some shrinkage. If the coefficient of thermal expansion of the glass is not sufficiently close to that of the ceramic substrate 12, the shrinkage results in warping of the substrate. When the coefficient of thermal expansion of the ceramic substrate 12 is greater than that of the glass coated thereon, the ceramic substrate 12 undergoes greater degree of shrinkage than the glass layer and, as shown in FIG. 1(B), warps such that the bottom face 13 thereof, i.e., bottom face of a glazed ceramic substrate 20 obtained at the end of the cooling step, becomes a concave surface whereas the solidified glass layer 14 becomes convex. The degree of the warping can be expressed by the vertical distance $d_S$ of the concave surface 13 of the glazed ceramic substrate 20 from the flat upper surface 11 of the base 10. This distance $d_S$ becomes maximal in a central region of the concave surface 13.

Figure 2:
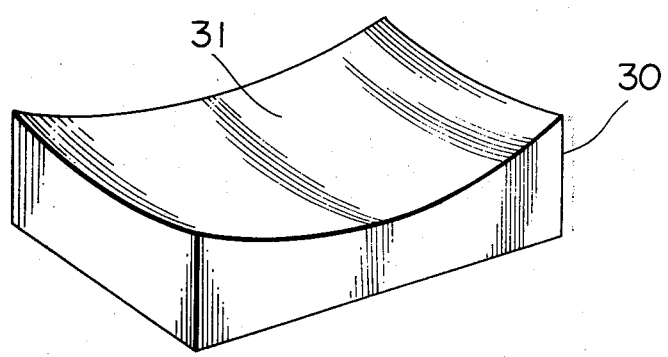
FIG. 2 is a perspective and explanatory illustration of a curved base for use in a method according to the invention.

FIG. 2 shows a refractory base 30 for use in a method according to the invention in place of the flat base 10 in FIGS. 1(A) and 1(B) for the purpose of preventing the glazed ceramic substrate from warping in the manner as shown in FIG. 1(B). The upper side of this base 30 is shaped into a concave surace 31 which is symmetrical, or approximately symmetrical, to the concave bottom surface 13 of the glazed ceramic substrate 20 in FIG. 1(B) with respect to a horizontal plane. In other words, the upper surface 31 of this base 30 is concaved so as to become a mirror image of the concaved bottom surface 13 in FIG. 1(B), if not optically exactly.

Figure 3A:
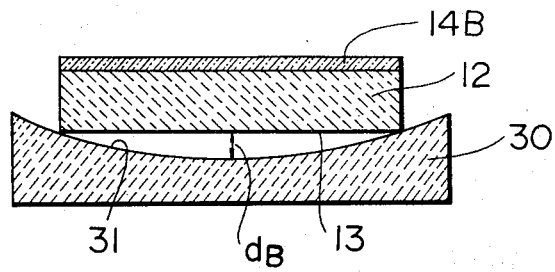
FIGS. 3(A), 3(B) and 3(C) explanatorily illustrate the manner of temporary deformation of an unfinished glazed ceramic substrate and spontaneous redressing of the temporary deformation in a method according to the invention.
Figure 3B:
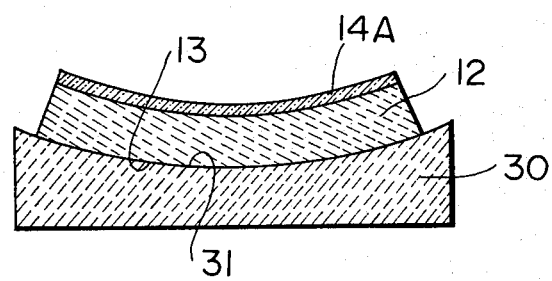
Figure 3C:
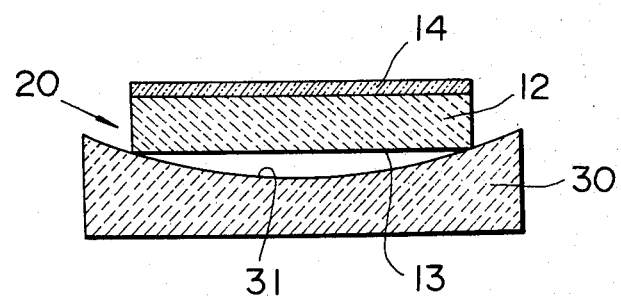

FIGS. 3(A) to 3(C) illustrate an embodiment of a glazing method according to the invention, wherein the ceramic substrate 12 and the glass used for glazing are identical with the counterparts in FIG. 1(A). Referring to FIG. 3(A), at the start of the firing step the ceramic substrate 12 coated with an unfired glass layer 14B is horizontally placed on the refractory base 30 of FIG. 2. Since the upper surface 31 of the base 30 is concaved in the above described manner, the ceramic substrate 12 makes contact with the concave surface 31 of the base 30 only at the four corners of its bottom face 13. In this state, the substrate 12 is heated together with the glass layer 14B to a temperature above the melting temperature of the glass and maintained at that temperatures for a sufficient period of time.

Referring to FIG. 3(B), the heating causes the ceramic substrate 12 to somewhat soften and undergo a deformation while the glass layer 14B in FIG. 3(A) turns into a molten glass layer 14A. As a result, the substrate 12 tends to deform into a convex shape on its bottom side and concave on its top side since the bottom face 13 of the substrate 12 is initially spaced from the upper surface 31 of the base 30. By the end of the firing step, the convex bottom face 13 of the ceramic substrate 12 comes into close contact with the concave surface 31 of the base 30. Thus, the deformation of the ceramic substrate 12 at this stage is reverse of the warping of the same substrate 12 at the cooling stage in the conventional method illustrated in FIG. 1(B).

At the cooling step for solidification of the molten glass layer 14A, the ceramic substrate 12 tends to warp so as to become concave on its bottom side and convex on its top side, but, as shown in FIG. 3(C), in the illustrated method according to the invention the warping of the ceramic substrate 12 at the cooling stage does not actually result in such a manner of warping as shown in FIG. 1(B) and, instead, results in recovery from the deformed state shown in FIG. 3(B). That is, the warping of the ceramic substrate 12 or the finished glazed ceramic substrate 20 at the cooling step completely offsets the intentional and reverse deformation of the substrate 12 at the heating step. Therefore, the glazed ceramic substrate 20 produced by this method is excellent in its flatness. When the ceramic substrate 12 in FIGS. 1(A) and 1(B) is a rectangular plate of alumina 100 mm wide and 300 mm long, the glazed ceramic substrate produced by using the flat base 10 warps lengthwise to the extent of about 2 mm (expressed by the maximal value of distance $d_S$) and also widthwise to the extent of about 0.5 mm. When the same ceramic substrate 12 is glazed by using the concave base 30 in the way as illustrated in FIGS. 3(A) to 3(C), the ultimate deformation of the glazed ceramic substrate becomes less than 0.2 mm either lengthwise or widthwise.

Referring again to FIG. 3(A), the degree of concaveness of the upper surface 31 of the base 30 is expressed by the depth $d_B$ of the concave surface 31 from the flat bottom 13 of the ceramic substrate 12 placed on the base 30. Actual values of the depth $d_B$ are experimentally determined prior to shaping of the base 30 with respect to a combination of a ceramic substrate and a glass employed to produce a glazed ceramic substrate. As a basic experiment, the ceramic substrate supported only at its two opposite side ends is heated at temperatures in a range suitable for glazing operations for a certain period of time to examine variations in the degree of deformation of the substrate with the heating temperature and heating time. As a more practical experiment, the ceramic substrate is glazed by using a flat base as shown in FIGS. 1(A) and 1(B) to measure actual values of the distance $d_S$ in FIG. 1(B) in various regions of the glazed substrate. Then the upper surface 31 of the base 30 is shaped such that in every region of the ceramic substrate placed on this surface 31 the depth $d_B$ in FIG. 3(A) nearly agrees with the distance $d_S$ in FIG. 1(B).

Strictly speaking, also thermal deformation of the base 30 itself should be taken into consideration in determining the shape of the upper surface 31. In practice, however, it is possible to dispense with such a strict consideration by using a refractory material having a sufficiently small coefficient of thermal expansion as the material of the base 31. In this regard, silicon carbide is a particularly suitable material. Thermal deformation of the base 31 made of silicon carbide is negligibly small compared with 0.1-0.2 mm deformation of the glazed ceramic substrate.

The ceramic substrate for use in a method of the invention can be selected from conventional ceramic plates prepared as ceramic substrates for electric or electronic devices. For example, alumina, beryllia, magnesia, steatite, forsterite and zirconia can be named as useful ceramic materials.

The glass as the coating material in a method of the invention is not specifically limited. In conventional methods of producing glazed ceramic substrates it is usual to use a lead glass containing $SiO_2$ and PbO as its principal components, and the same glass is of use also in the present invention. However, it is advantageous to use a glass composition containing, by weight, 50–60% of $SiO_2$, 10–30% of $Al_2O_3$, 15–30% of CaO and MgO, and 2–6% of $ZrO_2$ as essential components, optionally with the addition of small amount(s) of at least one of $TiO_2$, BaO, ZnO, PbO, $P_2O_5$, $B_2O_3$, $Na_2O$ and $K_2O$. The particulars of this glass are disclosed in our copending application. This glass is high in transition point and, hence, is excellent in high-temperature stability, and this glass is highly resistant to chemicals.

EXAMPLE

A granular glass composed of 56 parts by weight of $SiO_2$, 14 parts by weight of $Al_2O_3$, 4 parts by weight of $ZrO_2$, 22 parts by weight of CaO, 2 parts by weight of MgO and 2 parts by weight of $B_2O_3$ was pulverized into a fine powder by using a ball mill. A paste was prepared by mixing 100 parts by weight of the powdered glass with a solution of 1.5 parts by weight of ethyl cellulose in 50 parts by weight of terpineol. This paste was applied onto a major surface of a rectangular substrate of alumina ($Al_2O_3$ purity 96%), which was 100 mm wide, 300 mm long and 2 mm thick, by screen-printing to form a paste layer with a uniform thickness, and the paste layer was dried at about 100° C. for 1 hr to evaporate the terpineol contained in the paste. The coefficient of linear expansion of the alumina substrate was $70 \times 10^{-7}$/degree (0°-800° C.), and that of the glass was $55 \times 10^{-7}$/degree (0°-770° C.).

Figure 4:
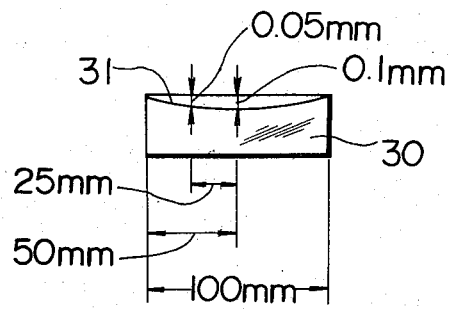
FIGS. 4 and 5 show an exemplary design of the curved surface of a base of the type as shown in FIG. 2.
Figure 5:
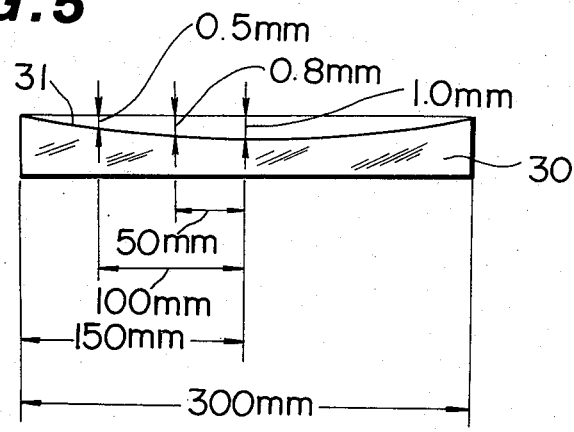

The thus treated alumina substrate was placed on a base shaped in the manner as shown in FIG. 2. The particulars of the concave surface 31 of this base are shown in FIGS. 4 and 5. Widthwise of the base 30, as shown in FIG. 4, the upper surface 31 was curved approximately parabolically and symmetrically about a horizontal line parallel to the longitudinal central axis of the base 30. Lengthwise of the base 30, as shown in FIG. 5, the upper surface 31 was more greatly curved approximately parabolically and symmetrically about a horizontal line parallel to the lateral central axis of the base 30. Accordingly, the concave surface 31 of this base 30 was a compound of two crosswise intersecting surfaces both of which are parabolically concave though different in curvature.

The base and the alumina substrate were heated in air to a temperature of 1400° C. and maintained at this temperature for 60 min to result in that the top face of the alumina substrate was uniformly coated with a molten glass layer and that the bottom face of the substrate came into close contact with the concave surface of the base. Thereafter the base and the substrate placed thereon were let cool down to room temperature to cause the molten glass layer on the alumina substrate to turn into a solid glass layer.

The glazed ceramic substrate obtained upon completion of cooling was very high in its flatness. Numerically, a deviation from an ideal flatness was less than 0.1 mm in every region of this substrate. At the screen-printing step the thickness of the paste layer was controlled such that the solidified glass coating layer had a thickness of 100 μm. The surface roughness of the coating layer was measured to be below 0.5 μm, meaning that the surface of this coating layer was remarkably high in smoothness. The transition point of the glass employed in this example was 770° C. As will be understood from such a high value of the transition point, the glazed ceramic substrate produced in this example was excellent in high-temperature stability, too. Accordingly this glazed ceramic substrate was evaluated as fully serviceable for a high-performance thermal head.

Figure 6:
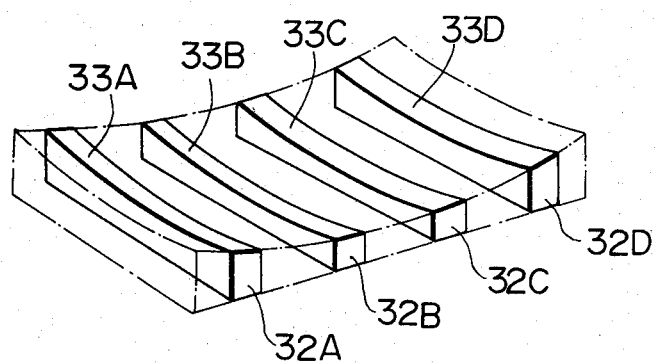
FIG. 6 is a perspective and explanatory illustration of a set of rib-like spacers as parts of a base that is a simplified modification of the base of FIG. 2.

The curved base 30 of FIG. 2 can be modified in the manner as shown in FIGS. 6, 7(A) and 7(B) with little difference in effect. The modified base consists of a flat base plate 34 and a plurality of rib-like spacers 32A, 32B, 32C, 32D which are placed on, and usually fixed to, the top face of the base plate 34 in a spaced and parallel arrangement. As illustrated in FIG. 6, the rib-like spacers 32A, 32B, 32C, 32D can be regarded as to be obtained by vertically slicing the base 30 of FIG. 2. Accordingly, the upper surface of each of these spacers 32A, 32B, 32C, 32D is a concave surface 33A, 33B, 33C, 33D which becomes a part of the concave surface 31 of the base 30 of FIG. 2.

On the base plate 34, the rib-like spacers 32A, 32B, 32C, 32D are arrayed at nearly equal intervals such that an imaginary surface given by smoothly connecting the concave surfaces 33A, 33B, 33C, 33D of all the spacers becomes a concave surface corresponding to the surface 31 of the base 30 of FIG. 2. When the ceramic substrate 12 is placed on the base of FIG. 7(A), only two spacers 32A, 32D located at the two opposite side ends of the base plate 34 make contact with the bottom face 13 of the substrate 12. Heating of the ceramic substrate 12 to fire the glass layer 14B is commenced in this state, and during the heating the substrate 12 deforms in the manner as shown in FIG. 7(B). As a result, the bottom face 13 of the substrate 12 comes into close contact with the concave surfaces 33A, 33B, 33C, 33D of all the spacers 32A, 32B, 32C, 32D. At the subsequent cooling stage, the substrate undergoes a warp reverse to the deformation at the heating stage and consequentially recovers from the deformed state of FIG. 7(B).

The total number of the rib-like spacers in each base can be made very small, and also the width of each spacer can be made narrow. For example, in the case of a base for a 100 mm wide and 300 mm long substrate it suffices to use four rib-like spacers each of which is 3-10 mm in width.

From an industrial point of view, the modified base shown in FIGS. 6, 7(A) and 7(B) is very advantageous because the total area of the curved surfaces 33A, 33B, 33C, 33D of this base is far smaller than the area of the curved surface 31 of the base 30 of FIG. 2 and, therefore, it is possible to greatly reduce the labor cost for shaping the curved surface.

Depending on the size of the ceramic substrate to be glazed and also on the degree of deformation of the substrate during glazing, there is a possibility of further simplifying the base of FIG. 7(A) by omitting the intermediately positioned spacers 32B and 32C. In that case, the height of the remaining two spacers 32A and 32D are adjusted such that the bottom face of the substrate deformed during the heating process comes into contact with the top face of the flat base plate 34 in its central region.

Sometimes, a further simplification is possible as illustrated in FIGS. 8, 9(A) and 9(B). In this case, the base consists of the flat base plate 34 and four pieces of low, pillar-like spacers 36A, 36B, 36C and 36D which are placed on the top face of the base plate 34 in its four corner regions, respectively. The upper surface of each of these spacers 36A, 36B, 36C, 36D is a curved surface 37A, 37B, 37C, 37D which becomes a part of the concave surface 31 of the base 30 of FIG. 2. Heating of the ceramic substrate 12 to fire the glass layer 14B is commenced by placing the substrate 12 on these spacers 36A, 36B, 36C, 36D as illustrated in FIG. 9(A). During the heating the substrate 12 deforms in the manner as shown in FIG. 9(B) to result in that a central region of the bottom face 13 of the substrate 12 comes into contact with the top face of the flat base plate 34, but at the subsequent cooling stage the substrate recovers from the deformed state to turn into a glazed ceramic substrate with good flatness. This base can be manufactured at a far lower cost than the base of FIG. 7(A). Furthermore, it is possible to shape the upper surface of each of these pillar-like spacers 36A, 36B, 36C, 36D into a slant and flat surface instead of the aforementioned curved surface 37A, 37B, 37C, 37D. When the substrate 12 and the base plate 34 in FIGS. 8 and 9(A) are considerably elongate ones, it is suitable to place an additional pillar-like spacer (not shown) at the middle between the spacers 36A and 36B, and another pillar-like spacer (not shown) at the middle between the spacers 36C and 36D.

What is claimed is:

1. In a method of producing a glazed ceramic substrate having the steps of applying a glass onto a major surface of a plate-shaped ceramic substrate, firing the glass-applied substrate at a temperature above the melting temperature of the glass to thereby form a molten glass layer on the substrate, and cooling the fired substrate to allow the molten glass layer to turn into a solid coating layer, the glass-applied substrate being placed on a refractory base during the firing and cooling steps, the improvement comprising said refractory base being so shaped as to allow the glass-applied substrate to deform during the firing step such that the deformation offsets against warping of the substrate attributed to a difference between the coefficient of thermal expansion of the glass coating and the coefficient of thermal expansion of the ceramic substrate during the cooling step.

2. A method according to claim 1, wherein said base is formed with a continuous and curved upper surface which is shaped such that when the substrate deforms during the firing step the bottom surface of the substrate comes into close contact with said curved outer surface.

3. A method according to claim 2, wherein the coefficient of thermal expansion of the ceramic substrate is greater than the coefficient of thermal expansion of the glass, said curved upper surface of the base being a concave surface.

4. A method according to claim 2, wherein the coefficient of thermal expansion of the ceramic substrate is smaller than the coefficient of thermal expansion of the glass, said curved outer surface of the base being a convex surface.

5. A method according to claim 1, wherein said base comprises a base plate having a flat upper surface and a plurality of spacers which are placed on said upper surface of said base plate and spaced from each other, each of said spacers being formed with a curved upper surface, said spacers being arranged such that when the glass-applied substrate deforms during the firing step the bottom surface of the substrate comes into contact with the curved upper surfaces of all the spacers but remains spaced from the upper surface of said base plate.

6. A method according to claim 5, wherein each of said spacers is an elongate member arranged so as to extend widthwise of said base plate.

7. A method according to claim 6, wherein said curved upper surface of each of said spacers is a concave surface.

8. A method according to claim 1, wherein said base comprises a base plate having a flat upper surface and a plurality of spacers which are placed on said upper surface of said base plate and spaced from each other, said spacers being shaped and arranged such that when the glass-applied substrate deforms during the firing step the bottom surface of the substrate partially comes into contact with said upper surface of said base plate.

9. A method according to claim 8, wherein each of said spacers is an elongate member arranged so as to extend widthwise of said base plate and has a curved upper surface.

10. A method according to claim 9, wherein said curved upper surface of each of said spacers is a concave surface.

11. A method according to claim 8, wherein said spacers are pillar-like members respectively located at corner regions of said base plate.

12. A method according to claim 11, wherein each of said spacers has a curved upper surface.

13. A method according to claim 11, wherein each of said spacers has a slant and flat surface.

14. A method according to claim 1, wherein said base is made of silicon carbide.

15. A method according to claim 1, wherein the step of applying the glass onto said major surface of the ceramic substrate comprises the step of printing a paste containing said glass in powdered form onto said major surface of the ceramic substrate.

16. A method according to claim 1, wherein said glass is a lead glass comprising $SiO_2$ and $PbO$ as principal components thereof.

17. A method according to claim 1, wherein said glass comprises 50 to 60% by weight of $SiO_2$, 10 to 30% by weight of $Al_2O_3$, 15 to 30% by weight of $CaO$ and $MgO$ which are used jointly, and 2 to 6% by weight of $ZrO_2$.

18. A method according to claim 17, wherein said glass further comprises at least one of $TiO_2$, $BaO$, $ZnO$, $PbO$, $P_2O_5$, $B_2O_3$, $Na_2O$ and $K_2O$.

19. A method according to claim 16 or 17, wherein the material of said ceramic substrate is selected from the group consisting of alumina, beryllia, magnesia, steatite, forsterite and zirconia.

* * * * *